United States Patent
Ishihara

(10) Patent No.: US 7,112,984 B2
(45) Date of Patent: Sep. 26, 2006

(54) SYSTEM LSI

(75) Inventor: Akihiro Ishihara, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/073,855

(22) Filed: Mar. 8, 2005

(65) Prior Publication Data

US 2005/0285615 A1 Dec. 29, 2005

(30) Foreign Application Priority Data

Jun. 29, 2004 (JP) .............................. 2004-191493

(51) Int. Cl.
  *G01R 31/02* (2006.01)
  *G11C 7/00* (2006.01)
(52) U.S. Cl. .................. 324/765; 324/158.1; 365/201; 365/185.33; 365/236; 714/718
(58) Field of Classification Search ............. 324/158.1, 324/765, 754; 365/201, 230.08, 191; 714/718, 714/719, 720, 738
See application file for complete search history.

(56) References Cited

U.S. PATENT DOCUMENTS 5,936,900 A * 8/1999 Hii et al. .................... 365/201
6,058,057 A * 5/2000 Ochiai et al. ............... 365/201
6,151,692 A * 11/2000 Smitlener et al. ........... 714/718

FOREIGN PATENT DOCUMENTS

JP  11-088142  3/1999

* cited by examiner

*Primary Examiner*—Nestor Ramirez
*Assistant Examiner*—Jimmy Nguyen
(74) *Attorney, Agent, or Firm*—Rabin & Berdo, P.C.

(57) ABSTRACT

On a clock supply route to a specified block such as a ROM, there are provided a clock delay circuit which includes a plurality of delay elements connected in series and a selector, such that a delay clock signal is selected and output in accordance with a delay control signal. During a product test, an operation test for the specified block is carried out in order to find out the delay adjustment signal that exhibits a proper operation. For this purpose, the delay adjustment signal is supplied from a delay adjustment terminal via a selector. When a value of the delay adjustment signal is obtained in the product test, the value of the delay adjustment signal is memorized to a delay setting circuit including a fuse circuit or a PROM. In a normal operation, the memorized value in the delay setting circuit is supplied to the clock delay circuit via the selector.

14 Claims, 3 Drawing Sheets

SYSTEM LSI

BACKGROUND OF THE INVENTION

1. Field of the Invention

The invention relates to a system LSI (Large Scale Integration) having a plurality of circuit blocks integrated therein and more particularly to a clock delay compensation circuit for preventing production of off-specification products due to production tolerance on a manufacturing process for the system LSI.

2. Description of the Related Art

FIG. 2 of the accompanying drawings is a schematic block diagram illustrating a conventional system LSI which is formed by a logic circuit 10 and a ROM (Read Only Memory) 20. Such system LSI is disclosed, for example, in Japanese Patent Kokai No. 11-88142.

The logic circuit 10 includes a plurality of circuit blocks such as a RAM (Random Access Memory) (not shown) and an input/output circuit (not shown) in addition to a CPU (Central Processing Unit) 11. These circuit blocks including the CPU 11 receive a clock signal CK0 via a clock tree buffer 12 where a phase of the clock signal CK0 is adjusted.

A memory content stored in the ROM 20, such as a program and fixed data to be processed in the CPU 11, is output as read data RD when a region having the memory content is specified by an address signal ADR supplied from the CPU 11. To a clock terminal C of the ROM 20, a clock signal CK1 used for read-timing is supplied from the clock tree buffer 12 of the logic circuit 10.

When the system LSI receives the clock signal CK0 representing the reference of the operation timing, the phases of the clock signals to be supplied to the circuit blocks including the ROM 20 are adjusted by the clock tree buffer 12, and then the adjusted clock signals are respectively supplied to the circuit blocks. Accordingly, each circuit block receives the clock signal in accordance with the timing that has been given due consideration to a delay caused by a difference of the signal route concerned, thereby making it possible for the circuit block to timely read the data supplied from a preceding circuit block.

Miniaturization of the system LSI and lowering of voltage in the LSI may increase malfunction due to an operation noise within the LSI, i.e., a noise caused by a switching operation of a transistor included in the LSI, and furthermore they may impact on a product yield due to production tolerance on a wafer process.

Scaling up of the system LSI increases the number of logic circuits that operate simultaneously, which leads to concern about off-specification products caused by the operation noise. As a countermeasure, such design approach is sometimes employed that shifts the timing of the clock signal of the logic circuit 10 from that of the ROM 20 within an extent that ensures a regular operation over the system LSI, so that the number of the circuit blocks operating simultaneously is reduced and thus the operation noise is reduced.

Even though the circuit blocks are appropriately arranged and the delay buffer for the clock signal is appropriately designed in a design phase in order not to synchronize the operations among the circuit blocks, the system LSI may not function in an expected manner due to production tolerance employed on a wafer process. Consequently, the timings of the clock signals may unexpectedly synchronize with each other, and thus the system LSI including the above circuit block may become an off-specification product.

SUMMARY OF THE INVENTION

An object of the invention is to prevent production of off-specification products due to production tolerance on a manufacturing process by incorporating a clock delay compensation circuit into a system LSI.

A system LSI according to a first aspect of the invention includes a plurality of circuit blocks including a specified block as a test object, a clock tree buffer for distributing a clock signal to the circuit blocks, a clock delay circuit provided on a clock supply route from the clock tree buffer to the specified block so as to delay the clock signal in accordance with a delay control signal, a first selector for either transferring a delay adjustment signal supplied from an outside to the clock delay circuit as the delay control signal when a test operation mode is designated by a mode signal, or supplying an internal delay setting signal to the clock delay circuit when a normal operation mode is designated by the mode signal, a second selector for either supplying a test signal to the specified block when the test operation mode is designated by the mode signal, or supplying a normal operation signal to the specified block when the normal operation mode is designated by the mode signal, and a delay setting circuit for memorizing and issuing a value of the delay adjustment signal as the internal delay setting signal. The value of the delay setting signal is obtained when the specified block operates properly during a test for the specified block, and the test is carried out by sequentially changing the delay adjustment signal.

There is provided the clock delay circuit on the clock supply route to the specified block such that the clock signal is delayed in accordance with the delay control signal. There is also provided the delay setting circuit which can memorize the value of the delay adjustment signal as the internal delay setting signal. The value of the delay adjustment signal is obtained when the specified block operates properly during the test for the specified block, and the test is carried out by sequentially changing the delay time of the clock signal. With this arrangement, even though there is some production tolerance on the manufacturing process, it is possible to prevent the production of off-specification products by determining an appropriate value of the delay adjustment signal during a product test and memorizing the value of the delay adjustment signal in the delay setting circuit.

On the clock supply route to the specified block such as a ROM, the clock delay circuit may include delay elements connected in series and a third selector, such that the delay clock signal is selected and output in accordance with the delay control signal. During a product test, an operation test for the specified block is carried out in order to find out the delay control signal that exhibits a proper operation. For this purpose, the delay adjustment signal is supplied from the outside via the first selector. When a value of the delay adjustment signal is obtained in the product test, the value of the delay adjustment signal is memorized to the delay setting circuit including a fuse circuit or a PROM (Programmable Read Only Memory). In the normal operation, the memorized value in the delay setting circuit is supplied to the clock delay circuit as the delay control signal via the first selector.

The above and other objects and novel features of the present invention will be more apparent by describing preferred embodiments thereof with reference to the accompanying drawings. It should be noted that drawings are merely shown for illustration and therefore by no means limit the scope of the present invention.

DETAILED DESCRIPTION OF THE INVENTION

Figure 1:
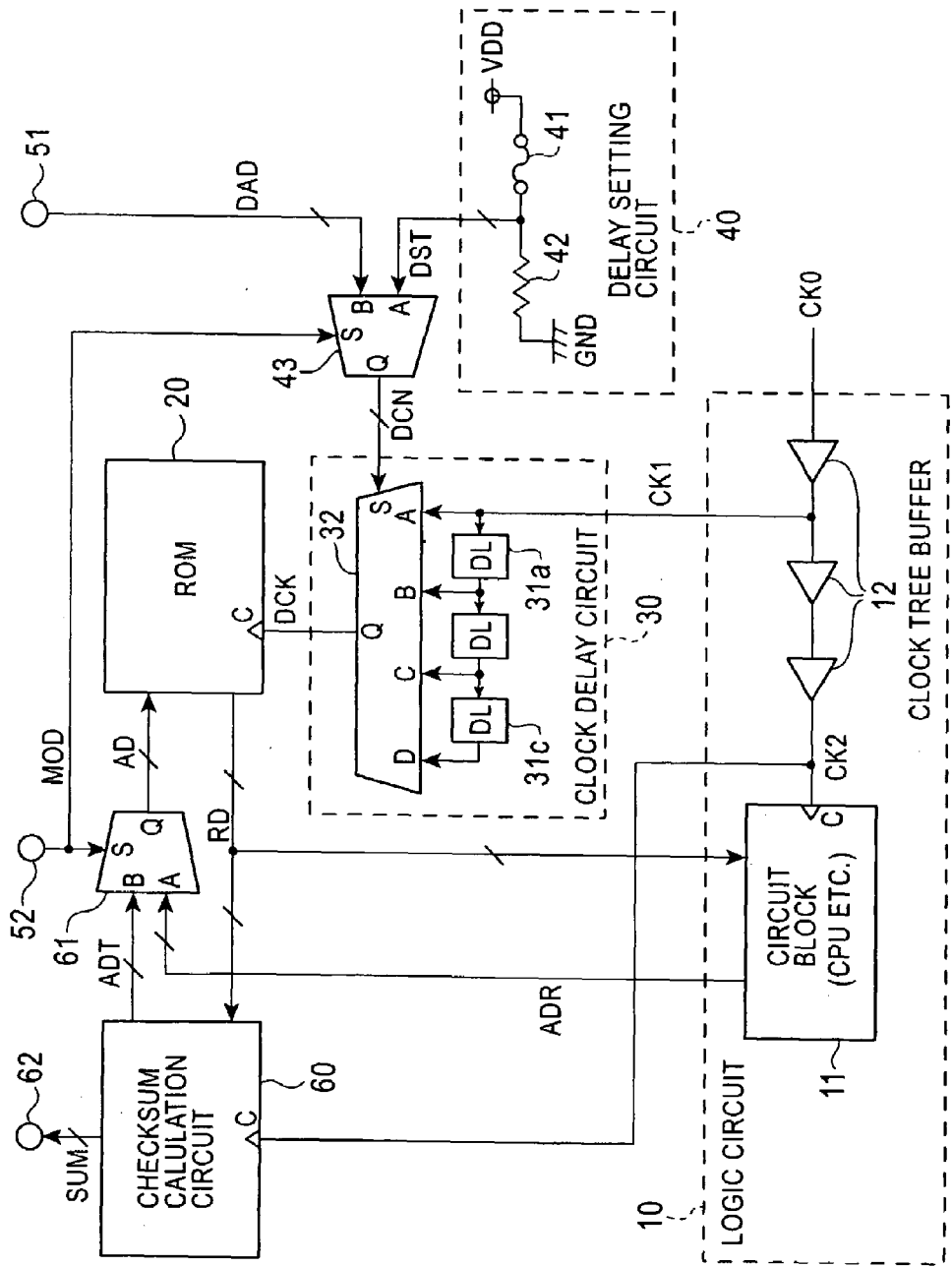
FIG. 1 is a block diagram illustrating a system LSI according to a first embodiment of the present invention.

Referring to FIG. 1, there is shown a block diagram of a system LSI illustrating a first embodiment of the present invention. The same reference numerals are used for the same elements as those used in FIG. 2.

Figure 2:
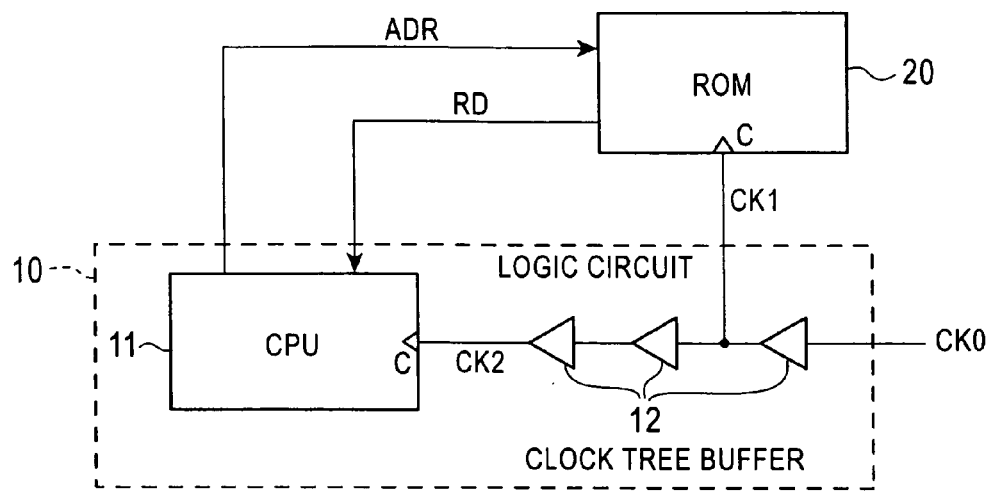
FIG. 2 is a schematic block diagram illustrating a conventional system LSI.

The system LSI includes a logic circuit 10, as similar to FIG. 2, having a plurality of circuit blocks such as a CPU 11, a RAM (not shown) and an input/output circuit (not shown). It should be noted that a circuit block, which may be sometimes referred to as a hard macro, is defined as a logic circuit component whose function and circuit pattern have been already fixed. A desired system LSI may be formed in such a manner that a circuit pattern having various circuit blocks is appropriately arranged on a semiconductor substrate based on a function of the system LSI concerned, the circuit blocks are connected with each other by means of a wiring pattern of signals and a power supply, and then clock supplying routes to all the circuit blocks are formed.

To the logic circuit 10, a clock signal CK0 representing the reference of an operation timing is supplied. After a phase of the clock signal CK0 is adjusted in a clock tree buffer 12, the clock signal is supplied to all the circuit blocks including the CPU 11. To a clock terminal C of the CPU 11, for example, a clock signal CK2 is supplied from an output of a last part of the clock tree buffer 12. From a middle part of the clock tree buffer 12, a clock signal CK1 is output and is supplied to a clock delay circuit 30 in order to supply the signal to a specified circuit block (the ROM 20, for example) which is a test object in the system LSI.

The clock delay circuit 30 includes a plurality of delay elements (DL) 31a–31c connected in series and a selector 32. This circuit outputs one of the clock signal CK1 itself and three clock signals that are respectively delayed by the delay elements 31a–31c as a delayed clock signal DCK in accordance with a designation by a delay control signal DCN. The delayed clock signal DCK is supplied to a clock terminal C of the ROM 20. The ROM 20 which is similar to that shown in FIG. 2 stores memory contents such as a program and fixed data which are processed in the CPU 11, and outputs the memory content as read data RD when a region having the memory content is specified by an address signal AD.

The system LSI further includes a delay setting circuit 40. The delay setting circuit 40 stores an appropriate delay adjustment amount for the clock delay circuit 30 which is obtained by a test after the manufacturing process. The delay setting circuit 40 includes, for example, a plurality of circuits each having a fuse 41 and a resistor 42 connected in series. The circuits are connected in parallel between a power potential VDD and a ground potential GND. With this arrangement, a delay setting signal DST corresponding to the condition of the fuse 41 that is either connected or disconnected is output from a connecting junction between the fuse 41 and the resistor 42.

The delay setting signal DST is supplied to an input terminal A of a selector 43, while to an input terminal B of the selector 43, a delay adjustment signal DAD is supplied from a delay adjustment terminal 51. The selector 43 selects the input terminal A when a normal operation mode is specified by a mode signal MOD supplied from a mode specification terminal 52, while it selects the input terminal B when a test operation mode is specified. The selector 43 accordingly supplies the selected signal as the delay control signal DCN from an output terminal Q to the clock delay circuit 30.

The system LSI further includes a checksum calculation circuit 60 and a selector 61 which perform the test after the manufacturing process. The checksum calculation circuit 60 sequentially increases an address signal ADT from zero and outputs the signal in accordance with a clock signal CK2 supplied to a clock terminal C. The checksum calculation circuit 60 cumulatively adds (without carry) the read data RD read from each address of the ROM 20, and then it outputs the cumulatively added amount to a checksum output terminal 62 as a checksum SUM.

The address signal ADT from the checksum calculation circuit 60 is supplied to an input terminal B of a selector 61, while an address signal ADR is supplied from the CPU 11 to an input terminal A of the selector 61. Then, from an output terminal Q of the selector 61, the address signal AD is supplied to the ROM 20. The read data RD from the ROM 20 is supplied to both of the CPU 11 and the checksum calculation circuit 60.

A test adjustment process immediately after the manufacturing process of the system LSI will be hereinafter described.

First, a test apparatus such as an LSI tester is connected to the delay adjustment terminal 51, the mode specification terminal 52 and the checksum output terminal 62, and then a test operation mode (for example, an 'H' level) is set in the mode signal MOD. Upon setting the test operation mode, the input terminals B are selected in the selectors 43 and 61, and the delay adjustment signal DAD supplied from the delay adjustment terminal 51 is supplied to the clock delay circuit 30 as the delay control signal DCN. The address signal ADT from the checksum calculation circuit 60 is supplied to the ROM 20 as the address signal AD.

Next, the delay adjustment signal DAD is set to zero, and the predetermined clock signal CK0 is supplied. Consequently, the address signals ADT are sequentially output from the checksum calculation circuit 60, and the memory contents of the ROM 20 corresponding to the address signals ADT are read and output as the read data RD. In the checksum calculation circuit 60, a series of the read data RD sequentially read from the ROM 20 are cumulatively added and the cumulatively added amount is output as a checksum SUM. Upon outputting the checksum SUM corresponding to whole memory contents of the ROM 20, the cumulatively added amount is compared with an amount previously calculated based on the memory contents of the ROM 20 so as to determine whether the cumulatively added amount is correct or not.

The above-described checksum tests are repeated one by one on assignable values of the delay adjustment signal DAD. When a correct checksum value is obtained, the assigned value of the delay adjustment signal DAD is memorized in the delay setting circuit 40 as a condition of the fuse 41 that is either connected or disconnected.

The system LSI on which the test and adjustment have been performed in the above-described manner after the manufacturing process is then incorporated into an apparatus for putting to use. In this instance, the mode specification terminal 52 is fixedly connected to an 'L' level so as to specify the normal operation mode.

Accordingly, since the delay setting signal DST set in the delay setting circuit 40 is supplied to the clock delay circuit 30 as the delay control signal DCN, the delayed clock signal DCK having an appropriate delay time is supplied from the clock delay circuit 30 to the ROM 20. In addition, the address signal ADR from the CPU 11 is supplied to the ROM 20 as the address signal AD.

As described above, the system LSI of the first embodiment includes the clock delay circuit 30 and the checksum calculation circuit 60 for adjusting the delay time of the clock signal to the ROM 20 after the manufacturing process. The system LSI further includes the delay setting circuit 40 for memorizing the adjusted value. With these arrangements, even though the timing of the clock signal is shifted from the design value due to the production tolerance on the manufacturing process, the shifted timing of the clock signal can be corrected product by product after the manufacturing process. Accordingly, the system LSI can alleviate malfunction due to an operation noise or a shift of a clock timing, and thus has an advantage to be able to prevent the production of off-specification products.

Even though the system LSI of the first embodiment has been described based on a structure utilizing the ROM 20 as a specified block for the test object, the specified block may be any circuit blocks other than the ROM. When, for example, a RAM is utilized as the specified block, a built-in type test circuit may be used in place of the checksum calculation circuit 60. When an analog-to-digital converter is utilized as the specified block, a self test circuit may be used. Further, instead of having the aforementioned test circuit, the system LSI may be formed to have a test terminal which connects to an LSI tester having a capability to test the circuit block concerned during the test process.

Further, even though the connecting or disconnecting condition of the fuse 41 is used to memorize the delay setting signal DST in the delay setting circuit 40 of the first embodiment, a PROM may be used instead.

Figure 3:
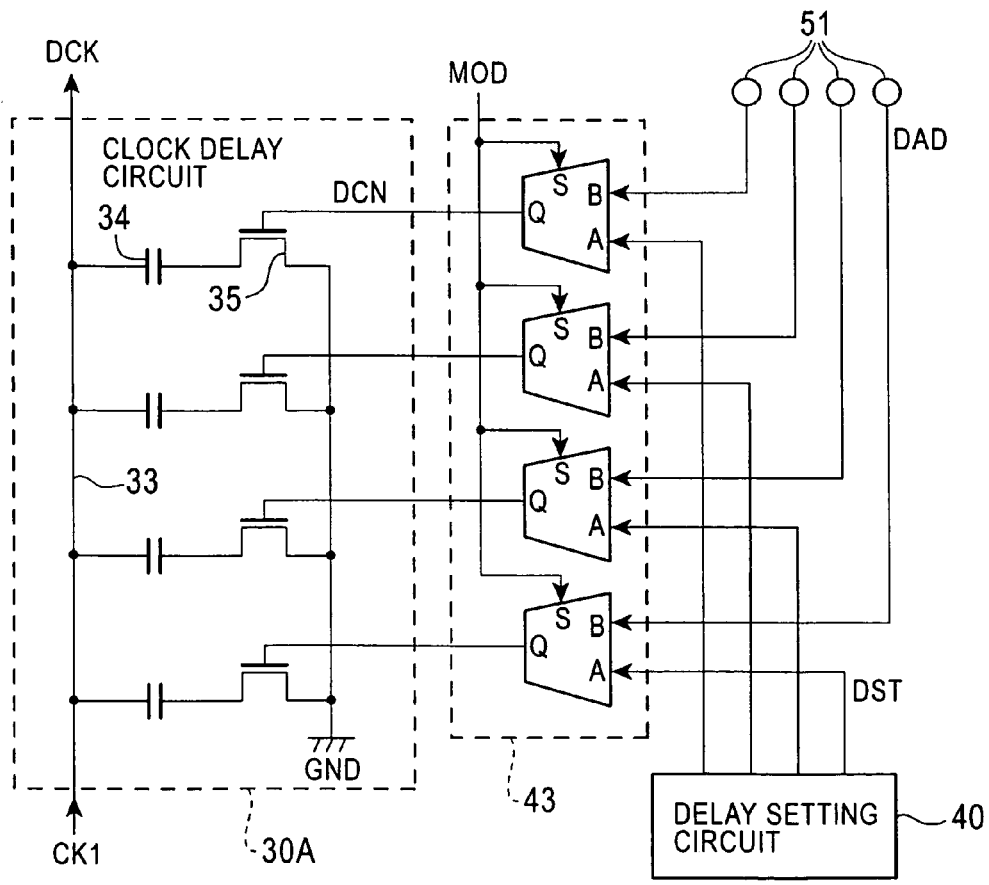
FIG. 3 is a block diagram illustrating a clock delay circuit according to a second embodiment of the present invention.

Referring to FIG. 3, there is shown a block diagram of a clock delay circuit of a second embodiment of the present invention.

A clock delay circuit 30A, provided in place of the clock delay circuit 30 shown in FIG. 1, has a plurality of capacitors 34 connected in parallel each via a transistor 35 for switching between a clock signal line 33 and the ground potential GND (the ground potential may be replaced by the power potential VDD). Each transistor 35 is individually switched on/off in accordance with a delay control signal DCN from a selector 43.

To one end of the clock signal line 33, a clock signal CK1 is supplied from a clock tree buffer 12, while from the other end of the clock signal line 33, a delayed clock signal DCK is supplied to a ROM 20.

In this clock delay circuit 30A, the transistors 35 are switched on/off in accordance with the delay control signals DCN so that the capacitances provided between the clock signal line 33 and the ground potential GND are controlled. Accordingly, a delay time of the clock signal CK1 passing through the clock signal line 33 is controlled, and thus the controlled clock signal is supplied to the ROM 20 as the delayed clock signal DCK. It should be noted that a procedure of the test and adjustment process of the system LSI after the manufacturing process using the clock delay circuit 30A as well as a procedure of the normal operation for putting to use as a product are similar to those described in the first embodiment, and thus the system LSI of the second embodiment has the similar advantages to those of the first embodiment.

Figure 4:
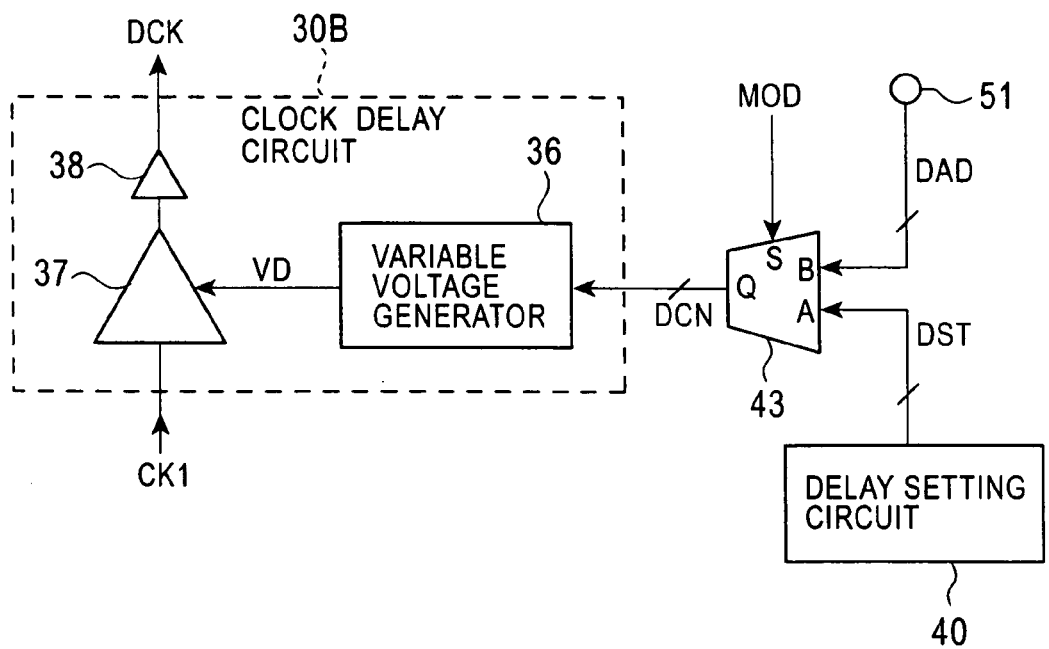
FIG. 4 is a block diagram illustrating a clock delay circuit according to a third embodiment of the present invention.

Referring to FIG. 4, there is shown a schematic block diagram of a clock delay circuit of a third embodiment of the present invention.

A clock delay circuit 30B, provided in place of the clock delay circuit 30 shown in FIG. 1, has a variable voltage generator 36 for generating a voltage VD in accordance with a value of the delay control signal DCN from a selector 43, a variable power supply voltage buffer 37 operated by the voltage VD as a power supply, and a level shift section 38 for shifting an output signal from the variable power supply voltage buffer 37 to a signal having a normal logic level.

To an input of the variable power supply voltage buffer 37, a clock signal CK1 is supplied from a clock tree buffer 12, while from the level shift section 38, a delayed clock signal DCK is output.

This clock delay circuit 30B has such a feature that when the voltage VD supplied from the variable voltage generator 36 to the variable power supply voltage buffer 37 is high, a delay of the clock signal is small, while when the voltage is low, the delay is large. By using this feature, a delay amount of the clock signal CK1 is controlled by the delay control signal DCN. It should be noted that a procedure of the test and adjustment process of the system LSI after the manufacturing process using the clock delay circuit 30B as well as a procedure of the normal operation for putting to use as a product are similar to those described above in the first embodiment, and thus the system LSI of the third embodiment has the similar advantages to those of the first embodiment.

This application is based on a Japanese Patent Application No. 2004-191493 which is herein incorporated by reference.

What is claimed is:

1. A system LSI comprising:
   a plurality of circuit blocks including a specified block as a test object;
   a clock tree buffer for distributing a clock signal to the plurality of circuit blocks;
   a clock delay circuit provided on a clock supply route from the clock tree buffer to the specified block so as to delay the clock signal in accordance with a delay control signal;
   a first selector for either transferring a delay adjustment signal supplied from an outside to the clock delay circuit as the delay control signal when a test operation mode is designated by a mode signal, or supplying an internal delay setting signal to the clock delay circuit when a normal operation mode is designated by the mode signal;
   a second selector for either supplying a test signal to the specified block when the test operation mode is designated by the mode signal, or supplying a normal operation signal to the specified block when the normal operation mode is designated by the mode signal; and
   a delay setting circuit for memorizing and issuing a value of the delay adjustment signal as the internal delay setting signal, wherein the value of the delay setting signal is obtained when the specified block operates properly during a test for the specified block, and the test is carried out by sequentially changing the delay adjustment signal.

2. The system LSI according to claim 1 wherein the clock delay circuit includes a plurality of delay elements connected in series for delaying the clock signal supplied from the clock tree buffer, and a third selector for selecting and outputting one of the clock signal and the clock signals delayed by the plurality of delay elements in accordance with the delay control signal.

3. The system LSI according to claim 1 wherein the clock delay circuit includes a plurality of capacitors connected in parallel each via a transistor for switching between the clock supply route and a ground potential or a power potential such that the transistors are switched on/off in accordance with the delay control signal.

4. The system LSI according to claim 1 wherein the clock delay circuit includes a variable voltage generator for generating a power supply voltage in accordance with the delay control signal, and a variable power supply voltage buffer operated by the power supply voltage for changing and outputting a delay time of the clock signal supplied from the clock tree buffer.

5. The system LSI according to claim 1 wherein the delay setting circuit outputs the delay control signal based on connection or disconnection of a plurality of fuses.

6. The system LSI according to claim 1 wherein the delay setting circuit includes an electrically writable nonvolatile memory.

7. The system LSI according to claim 1 wherein the delay setting circuit includes a PROM.

8. The system LSI according to claim 1 further including a test circuit having capability to carry out a checksum calculation, a built-in type test, or a self test.

9. A system LSI comprising:
   a plurality of circuit blocks including a specified block as a test object;
   first means for distributing a clock signal to the plurality of circuit blocks;
   second means provided on a clock supply route from the first means to the specified block so as to delay the clock signal in accordance with a delay control signal;
   third means for either transferring a delay adjustment signal supplied from an outside to the second means as the delay control signal when a test operation mode is designated by a mode signal, or supplying an internal delay setting signal to the second means when a normal operation mode is designated by the mode signal;
   fourth means for either supplying a test signal to the specified block when the test operation mode is designated by the mode signal, or supplying a normal operation signal to the specified block when the normal operation mode is designated by the mode signal; and
   fifth means for memorizing and issuing a value of the delay adjustment signal as the internal delay setting signal, wherein the value of the delay setting signal is obtained when the specified block operates properly during a test for the specified block, and the test is carried out by sequentially changing the delay adjustment signal.

10. The system LSI according to claim 9 wherein the second means includes a plurality of sixth means connected in series for delaying the clock signal supplied from the first means, and seventh means for selecting and outputting one of the clock signal and the clock signals delayed by the plurality of sixth means in accordance with the delay control signal.

11. The system LSI according to claim 9 wherein the second means includes a plurality of capacitors connected in parallel each via a transistor for switching between the clock supply route and a ground potential or a power potential such that the transistors are switched on/off in accordance with the delay control signal.

12. The system LSI according to claim 9 wherein the second means includes eighth means for generating a power supply voltage in accordance with the delay control signal, and ninth means operated by the power supply voltage for changing and outputting a delay time of the clock signal supplied from the first means.

13. The system LSI according to claim 9 wherein the fifth means outputs the delay control signal based on connection or disconnection of a plurality of fuses.

14. The system LSI according to claim 9 wherein the fifth means includes an electrically writable nonvolatile memory.

* * * * *